United States Patent [19]
Ando et al.

[11] Patent Number: 5,095,356
[45] Date of Patent: * Mar. 10, 1992

[54] CELLULAR INTEGRATED CIRCUIT AND HIERARCHICAL METHOD

[75] Inventors: Hisashige Ando, Santa Clara; Hung C. Lai, Cupertino; John J. Zasio, Sunnyvale, all of Calif.

[73] Assignee: Fujitsu Limited, Kawasaki, Japan

[*] Notice: The portion of the term of this patent subsequent to Nov. 6, 2007 has been disclaimed.

[21] Appl. No.: 594,309

[22] Filed: Oct. 9, 1990

Related U.S. Application Data

[63] Continuation of Ser. No. 47,551, Apr. 27, 1987, Pat. No. 4,969,029, which is a continuation of Ser. No. 557,413, Nov. 30, 1983, abandoned, which is a continuation of Ser. No. 414,835, Sep. 3, 1982, abandoned, which is a continuation of Ser. No. 150,692, May 16, 1980, abandoned, which is a continuation of Ser. No. 847,478, Nov. 1, 1977, abandoned, which is a continuation-in-part of Ser. No. 801,907, May 31, 1977, abandoned.

[51] Int. Cl.⁵ .................... H01L 27/10; H01L 27/02
[52] U.S. Cl. ........................ 357/45; 359/40; 359/41; 359/42
[58] Field of Search ............ 357/45, 40, 41, 42

[56] References Cited

U.S. PATENT DOCUMENTS 3,943,551  3/1976  Skorup .................... 357/42
4,969,029  11/1990  Ando et al. ............... 357/42

Primary Examiner—Rolf Hille
Assistant Examiner—Wael Fahmy
Attorney, Agent, or Firm—Flehr, Hohbach, Test, Albritton & Herbert

[57] ABSTRACT

Integrated circuit formed from a semiconductor body having a rectangular grid pattern formed on the body. The grid pattern is defined by lines extending at right angles to each other along X and Y axes. A plurality of basic cells are provided which have a plurality of active elements therein. Each of the basic cells is selected from a limited number of basic cells of different designs. Each of the basic cells is disposed within a rectangular area no greater than a predetermined size and overlying a plurality of grid lines on both the X and Y axes so that each basic cell overlies a plurality of intersections of the grid lines which define predetermined grid points. Each basic cell includes a power bus, a ground bus, input leads and an output having a predetermined arrangement with respect to certain grid points. The power bus and ground bus and the input leads and output of each basic cell are connected to the basic cell. Leads are provided for connecting the basic cells to form larger integrated circuit units which are called unit cells. The unit cells are connected to form still larger integrated circuits called a function block (FB).

11 Claims, 5 Drawing Sheets

CELLULAR INTEGRATED CIRCUIT AND HIERARCHICAL METHOD

RELATED APPLICATIONS
BACKGROUND OF THE INVENTION

Integrated circuits have heretofore been provided which have been characterized as utilizing large scale integration (LSI). However, the utilization of LSI has several limitations. Although LSI has greatly reduced the cost per unit of logic, there is still a great need to reduce the cost of such logic. In addition, there is a need to increase the speed at which the active devices in the integrated circuits communicate with each other. There is, therefore, a need for developing a larger scale LSI hich, for example, can be called extremely large scale integration that can be utilized to implement these requirements.

SUMMARY OF THE INVENTION AND OBJECTS

The cellular integrated circuit consists of a semiconductor body which can be in the form of a semiconductor wafer. A rectangular grid pattern is formed on the body which defines a plurality of rectangular areas on the body. A plurality of grid points are disposed in a predetermined arrangement within each rectangular area. A plurality of basic cells having active elements therein are formed in the body. Each of the basic cells conforms to one of a limited number of basic designs. Each of the basic cells is disposed in a rectangular area and overlies a plurality of grid points. Each of the basic cells has power and ground buses in a predetermined arrangement with respect to certain grid points. Each basic cell has input leads and an output lead. The power and ground buses and the input and output leads in each basic cell are connected to the basic cell. Leads are provided for interconnecting the basic cells to form a larger integrated circuit.

In general, it is an object of the present invention to provide a celluair integrated circuit and hierarchical method for making the same which utilizes basic cells having a plurality of active elements therein with each basic cell conforming to one of a limited number of basic cells.

Another object of the invention is to provide an integrated circuit and method of the above character in which the basic cells are disposed on a rectangular grid pattern defined by grid lines on X and Y axes in rectangular areas of a predetermined size or less and overlie grid points on intersections of the grid lines disposed within the rectangular areas.

Another object of the invention is to provide an integrated circuit and method of the above character in which the basic cells are utilized as building blocks in a hierarchical structure.

Another object of the invention is to provide an integrated circuit and method of the above character in which the spacing between the grid lines can be changed to change the size of the basic cells.

Another object of the invention is to provide an integrated circuit and method of the above character in which the basic cell size can be changed without changing the interconnections or routings between the basic cells.

Another object of the invention is to provide an integrated circuit and method of the above character which makes it possible for an individual designer to handle more complex integrated circuits.

Another object of the invention is to provide an integrated circuit and method of the above character which provides a lower cost per unit of logic and increased performance.

Another object of the invention is to provide an integrated circuit and method of the above character which has a very low failure rate.

Additional objects and features of the invention will appear from the following description in which the preferred embodiments have been set forth in conjunction with the accompanying drawings.

BRIEF DESCRIPTION OF THE DRAWINGS

FIG. 1b is a cross-sectional view taken along the line 1b–1b of FIG. 1a.

FIG. 1c is a logic diagram of the inverter shown in FIG. 1a.

FIG. 1d is a cross-sectional view taken along the line 1d–1d of FIG. 1a.

FIG. 4b is a block diagram of the unit cell shown in FIG. 4a.

FIG. 4c is a cross-sectional view taken along the line 4c–4c of FIG. 4a.

FIG. 5b is a block diagram of the unit cell shown in FIG. 5a.

FIG. 5c is a cross-sectional view taken along the line 5c–5c of FIG. 5a.

FIG. 6b is a block diagram of the physical layout shown in FIG. 6a.

DESCRIPTION OF PREFERRED EMBODIMENTS

The cellular integrated cirucit incorporating the present invention is shown in FIG. 1–8 of the drawings. In FIG. 1a, there is shown a plan view of a portion of the cellular integrated circuit incorporating the present invention. The portion shown in FIG. 1a consists of a basic cell which is only one of seven basic cells which are utilized in the present invention. The basic cell which is shown in FIG. 1a has been identified as basic cell BC1. The seven basic cells consist of the following:

| | |
|---|---|
| BC1 | Inverter |
| BC2 | 2 Input NAND |
| BC3 | 3 Input NAND |
| BC4 | 4 Input NAND |
| BC5 | 2 Input 2 Wide AND - OR Inverter |
| BC6 | 2 Input NOR |
| BC7 | Transmission gate |

Figure 2A:
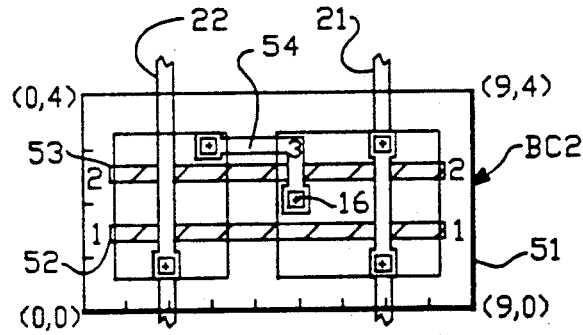
FIG. 2a is a top plan view of another basic cell showing a two input NAND gate and FIG. 2b shows the logic diagram therefor.
Figure 3A:
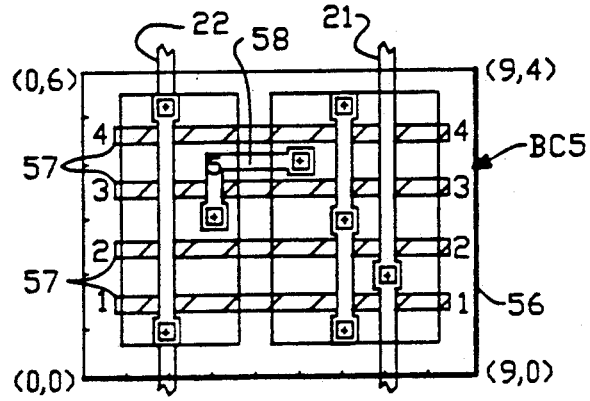
FIG. 3a is a top plan view of another basic cell which consists of a two input two-wide AND-OR-INVERTER and FIG. 3b shows the logic diagram therefor.

The basic cells BC2 and BC5 are shown in FIGS. 2a and 3a, respectively, to show the general manner of construction utilized in the basic cells. The other cells have not been shown because with the teaching herein disclosed, one skilled in the art would have no difficulty in fabricating the same. The basic cells BC1 through BC7 constitute the lowest order element which is utilized in the hierarchy which is involved in fabricating the cellular integrated circuit of the present invention. These basic cells are utilized as building blocks in the hierarchy as hereinafter described. All of the basic cells are fabricated in a semiconductor wafer 11 of a conventional type. For example, a silicon semiconductor wafer of either a three-inch or four-inch diameter is preferably used in order to make possible the fabrication of an extremely large scale integrated circuit utilized in the hierarchical method herein described.

It should be possible to utilize the herein described integrated circuit design and the ,hierarchical method also herein described in conjunction with different types of circuitry and or devices. At this point in time, there are three types of circuits or devices which are particularly adapted for the present integrated circuit and method which can be identified as complimentary metal oxide semiconductor (CMOS), N channel MOS (NMOS) and I²L. As is known to those skilled in the art, I²L is bipolar circuitry whereas CMOS and NMOS are both MOS types of circuitry.

In evaluating the different types of circuits, it was found that the various types of circuits had various trade offs. In analyzing the circuits it was found that a CMOS requires approximately 1.3 times the amount of transistors than does NMOS to build the same functional block. In CMOS, there are wiring restrictions which require that almost all of the corresponding gates of the N channel transistor and the P channel transistor be connected together (except the transmission gate) and that all of the corresponding drains of the N channel transistors and the P channel transistors should be connected together by conductors to obtain the output node.

In the case of NMOS, the gate of the load transistors should be connected to the output node. This is not a severe restriction because the output node can be connected with the polysilicon layer and the diffusion layer or the aluminum layer.

In comparing the processing steps between CMOS and NMOS, approximately two more steps were required for CMOS than NMOS with the same number of masks (8) being required.

In analyzing other features of the various circuits, it is found that the CMOS gates have several advantageous DC characteristics. The CMOS gates or inverters provide more noise immunity than NMOS. With CMOS excellent current sourcing capabilities can be obtained. In addition the P channel load transistors operates in the open drain mode which is more effective than the source follower mode in the case of the NMOS load transistor. The DC function of the CMOS circuit is not influenced by changes in the power supply voltage. CMOS gates have the advantage of a small power consumption because of the negative standby requirement. This is a particularly important feature where the system is designed in which the probability for the device to operate is small as for example less than 15%. CMOS gates are superior to NMOS gates when the clock rate of the system is relatively slow in comparison with the intrinsic gate switching speed.

In logic implementation and in circuit design, the CMOS circuitry is advantageous because it is not necessary to compensate for the "on" voltage level. It is easy to balance the rise time and the fall time. In addition it makes it possible to utilize a low "on" and high "off" impedance transmission gate. In NMOS circuitry, the circuitry can be made with fewer transistors than CMOS. In the case of circuit density, the NMOS is superior to CMOS but on the other hand the device area occupied by CMOS and NMOS is approximately the same. However, in the case of simple gates, the CMOS gate may occupy as much as 1.6 times the area of an NMOS gate. Weighing all of the various considerations, CMOS circuitry and devices have been utilized in the embodiment of the invention shown in the drawings.

The general construction and fabrication of CMOS devices is well known to those skilled in the art and therefore will not be described in detail.

The number of basic cells has been kept relatively small because in order to achieve maximum flexibility the number of indivisible elements i.e. the basic cell should be small. In connection with the present design of the integrated circuit, it also is desired to keep the basic cell relatively small in respect to the area which it occupies on the wafer. By way of example in the present design, it has been found desirable to limit the size of the basic cell so that the largest basic cell would not exceed an area of 9 grid spacings by 6 grid spacings or a total of 54 square grid spaces. This makes it possible to precisely tailor the power input for the basic cells. It should be appreciated however that if desired the basic cell can be made larger or smaller without departing from the design concept herein disclosed.

Figure 1A:
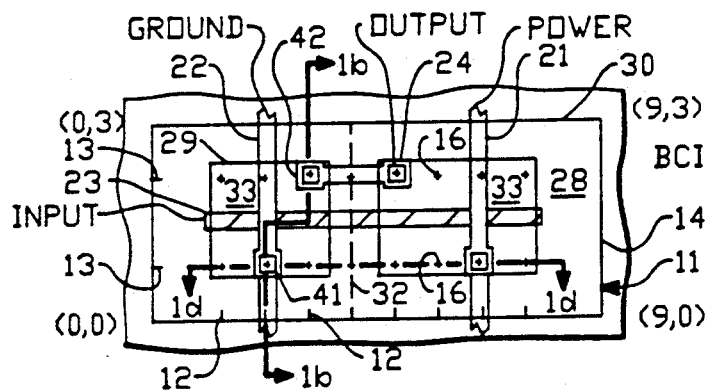
FIG. 1a is a top plan view of a basic cell incorporating the present invention and showing an inverter.
Figure 1C:
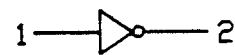

All of the basic cells are also designed on a rectangular grid pattern which is defined by the horizontal grid markings or lines 12 and the vertical grid markings or lines 13 shown in FIG. 1a lying on X and Y axes respectively. The scale of the grid markings is arranged in such a manner so that the scale ca be increased or decreased to change the size of the grid for purposes hereinafter described. The spacing between the horizontal grid markings 12 and the vertical grid markings 13 can be the same or different as desired. In the present embodiment, the spacing between the grid markings have the relationship of 8 to 10 with the relationship of 10 corresponding to the spacing between the vertical grid markings 13 and the spacing 8 corresponding to the spacing between the horizontal grid markings 12 for purpose hereinafter described. More specifically the spacing between the vertical grid markings 13 is 10 $\mu$ and the spacing between the horizontal grid markings 12 is 8 $\mu$ in the present invention.

The grid pattern has also been designed so that each intersection of the grid lines can be established by Cartesian coordinates as for example the Cartesian coordinates in the units shown in FIG. 1a to locate the four corners of the rectangle 14 in which the basic cell is formed. It is noted that the seven basic cells BC1 through BC7 do not exceed an area of 9 horizontal grid spacings by 6 vertical grid spacings or a total 54 square grid spaces. However, it should be appreciated that the basic cells need not necessarily have the same geometrical shape. They can have different rectangular shapes with the only design constraint being that they do not exceed the maximum desired area of 54 square grid spaces as pointed out above.

Within the rectangle formed on the grid pattern there are also provided a plurality of grid points 16 which are located within the basic cell and which also lie on intersections of the vertical and horizontal grid lines of the grid pattern. These grid points on intersections of the grid lines 12 and 13 are indicated by crosses 16 as shown in FIG. 1a. The positions of these crosses 16 also can be located by Cartesian coordiantes. Thus, it can be seen that each basic cell will overlie certain grid points 16.

Each of the basic cells is provided with two spaced apart and parallel power connections or leads 21 and 22 with the lead 21 being a power lead or bus and lead 22 being a ground lead or bus. It is also provided with one or more input leads and one or more output terminals or leads. Thus, the basic cell shown in FIG. 1a is provided with at least a single input lead 23 and a single output lead 24. It can be seen from the arrangement shown that the ground and power leads extend in a vertical direction whereas the input and the output leads extend in a horizontal direction at right angles to the ground and power buses which intersect in the regions occupied by the basic cells. In the basic cell shown in FIG. 1a, it can be seen that the basic cell has a length of 9 and a width of 3 to provide a basic dimension of 27.

Figure 1E:
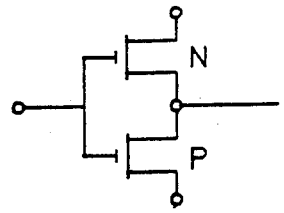
FIG. 1e is a circuit diagram showing the two CMOS transistors which make up the inverter shown in FIG.s 1a, 1b and 1c.
Figure 1D:
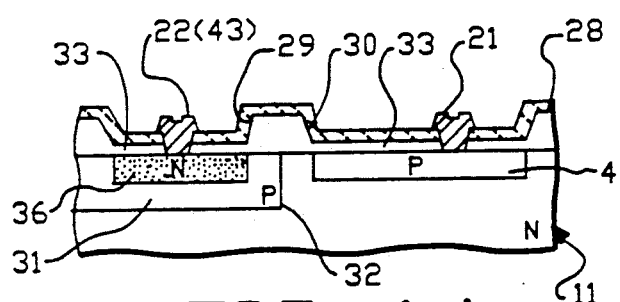
Figure 1B:
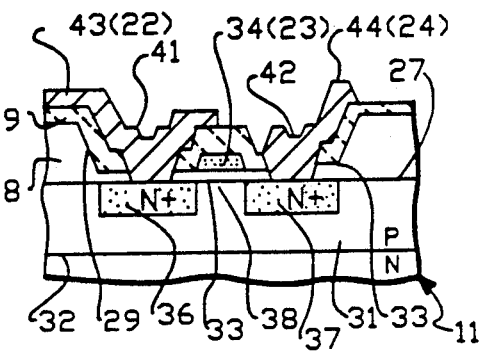

A cross sectional view of the basic cell in FIG. 1a is shown in FIG. 1b. As shown in FIG. 1b it consists of a conventional CMOS type construction in which the silicon semiconductor body 11 is doped with an N-type impurity. To provide an N-type region the body 11 has a surface 27 on which there is deposited a field oxide layer 28. Large openings or windows 29 and 30 are formed in the field oxide layer 28 to expose the surface 27. A P-type well or region 31 is formed by ion implantation in the body 11 through the field oxide layer 28 and is defined by a PN junction 32 which extends to the surface 27. A thin gate oxide layer 33 is grown on the surface 27 in the opening 29. A polycrystalline layer is then formed on the gate oxide layer 33 and etched to provide a polycrystalline gate 34. N+ source and drain regions 36 and 37 are implanted using the gate 34 and the field oxide 28 as a mask. A channel region 38 is formed between the source and drain regions 36 and 37 and underlies the gate 34.

A glass layer 39 is deposited on the field oxide layer 28 and into the opening 29. Contact openings 41 and 42 are formed through the glass layer 39 and the gate oxide layer 33 to expose the surface 27 overlying the source and drain regions 36 and 37. A layer of metallization of a suitable material such as aluminum is provided on the glass layer 39 and extends through openings 41 and 42 to make contact to the source and drain regions 36 and 37 to provide source and drain leads 43 and 44 which also can be identified as the input lead 22 and the output lead 24 respectively.

Another cross sectional view of the basic cell in FIG. 1a is shown in FIG. 1d. As shown in FIG. 1d the P-type well 31 is defined by the PN junction 32 which extends to the surface 27 between the openings 29 and 30. The opening 30 is for making a P channel transistor element. P-type source region and drain region 40 are also formed by ion implantation using the polycrystalline gate and the field oxide 28 as a mask.

Figure 4A:
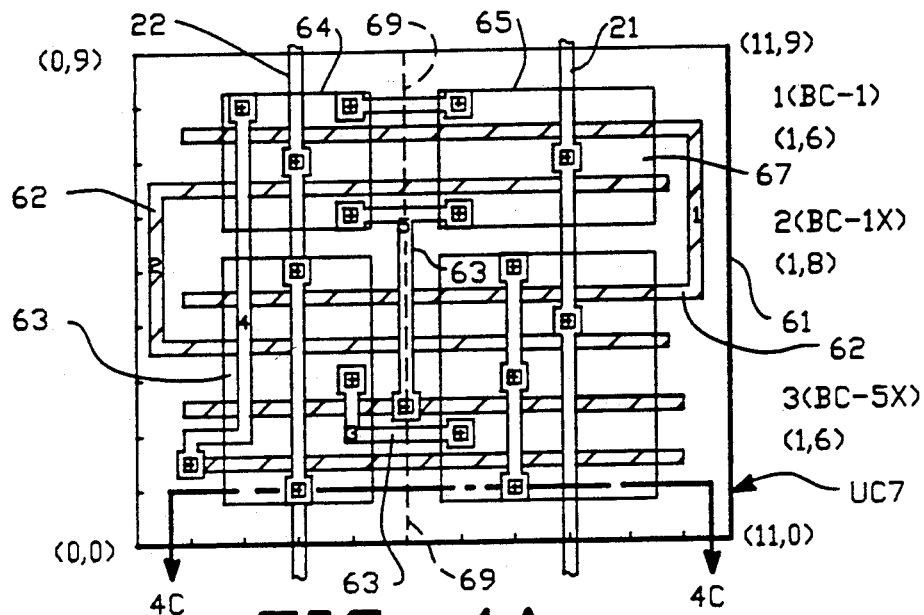
FIG. 4a is a top plan view of a unit cell which shows a two input exclusive OR which is composed of two types of basic cells, basic cells 1 and 5.

In FIG. 1a, the output lead 24 is within the interior of the rectangle 14. Access to the output lead 24 can be readily obtained by providing a second layer of insulating material (not shown) forming a via through the second layer of insulating material to the output pad or lead 24 and forming a second layer of metallization on the second layer of insulating material to form a connection to the via. Access can also be obtained through a via between the first layer metallization and the drain region 37 as shown in FIGS. 4a, 5a and 6a and as hereinafter described Because CMOS circuitry is being utilized, the leads can be relatively thin, particularly since there is minimal static power consumption by the circuit. In other words there is no standby power requirement.

With the arrangement shown it can be seen that all of the crucial parts of the circuitry of the basic cell are laid out in such a manner that they overlie crosses 16. This is true in respect to the power and ground buses 21 and 22 and the output lead 24. By placing the output lead 24 within the interior of the rectangular area gives flexibility in the interconnection of the basic cells to form a unit cell and other larger integrated circuits as hereinafter described.

FIG. 1e is a circuit diagram of the inverter shown in FIGS. 1a, 1b, 1c and 1d and shows that the inverter consists of two complimentary N channel and P channel CMOS transistors.

Figure 2B:
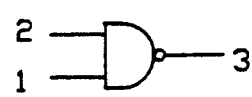

In FIGS. 2a and 2b there is shown a two input NAND gate which utilizes the same basic geometry as the basic cell in FIG. 1a. As can be seen, the rectangle 51 which is utilized for the basic cell BC2 is larger than the rectangle 14 for the basic cell BC1. From the Cartesian coordinates provided it can be seen that the rectangle has a length of 9 and a width of 4 to provide total area of 36. The same single power and ground buses 21 and 22 are provided. Two spaced apart and parallel horizontal input leads 52 and 53 are provided and an output lead 54. The inputs have also been labeled with the numbers 1 and 2 and the output with number 3. From examination of FIG. 2a it can be seen that the same type of organization is utilized in the basic cell BC2 as in the basic cell BC1.

Figure 3B:
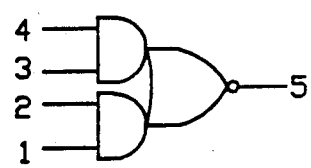

In FIGS. 3a and 3b there is shown a two input two-wide AND-OR-INVERTER. A still larger rectangle 56 is provided for this basic cell BC5 which has again the length of 9 and a width of 6 for a total area of 54. The same type vertical power and ground buses 21 and 22 are provided. Four separate spaced apart parallel and horizontal input leads 57 have been provided which have been numbered 1 through 4 as shown. An output lead or bus 58 has been provided which has been numbered 5.

From the three basic cells hereinbefore described, a single power bus and a single ground bus are provided for each basic cell which extend in a vertical direction at right angles to the input buses and intersect therewith as appearing in the drawings. In almost all cases, the output lead or contact is provided within the interior of the rectangle.

It should be appreciated that although all of the output leads have been shown within the interior of the basic cells, if desired, it is possible to place the input and output connections for the basic cells near the outer perimeters of the basic cells. However, this has a disadvantage in that it makes the basic cell larger than when the output is placed within the interior of the rectangular basic cell. It should be noted with respect to the basic cells which are shown in FIGS. 1a, 2a, and 3a that there are areas in the basic cells between the inputs and on the right and left hand sides as viewed in the drawings which can be utilized for connection areas through which connections can be made directly to the sources and drains as by forming vias through the insulating layers overlying the same.

Figures 4B, 4C:
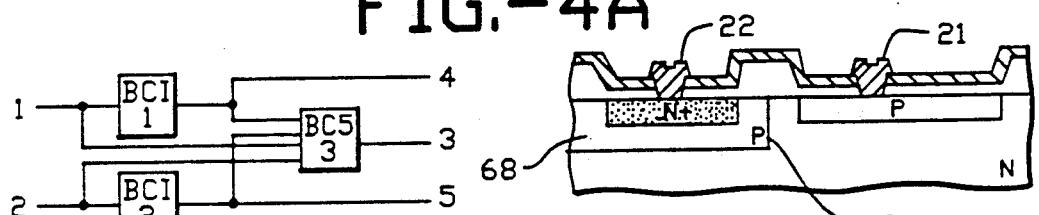

In FIGS. 4a and 4b there is shown the construction of a unit cell UC7 which is the next higher level in the hierarchy utilized in connection with the present integrated circuit design. The unit cell is comprised of a plurality of basic cells. It can be seen, the unit cell UC7 shown in FIG. 4a uses a considerably larger rectangle 61 which has a dimension of 11 in one direction and 9 in another for a total area of 99. The spacings between the horizontal grid lines and vertical grid lines represent 10 microns and 8 microns, respectively, and this would represent a distance of 88 microns in one direction and 90 microns in another direction.

From FIG. 4a it can be seen that the various basic cells utilized in the unit cell UC7 use the same power bus 21 and the same ground bus 22. Two inputs 62 which have been provided have been identified with the numerals 1 and 2. In addition, three output leads 63 have been provided which carry the numerals 3, 4, and 5. When the designations X and Y are utilized, this indicates that the basic cell has been flipped or turned over with respect to the horizontal axis, the X axis, or the vertical axis, the Y axis, respectively. Thus, generally speaking there are four basic positions for each basic cell and one is the position shown in FIG. 1a and the second is when it is flipped about the X or horizontal axis. A third position is obtained by flipping about the Y or vertical axis and the fourth is obtained by flipping about both the X and Y axis which is equivalent to rotating the entire cell by 180 degrees.

Being able to flip the basic cells is advantageous because it makes it possible to share some regions in the basic cells. When a region can be shared, the two combined regions will take less area than two separate regions. More specifically the upper small rectangles 64 and 75 include two basic cells 1(BC-1) and 2(BC-1x) in the upper portions thereof. The basic cells 1(BC-1) and 2(BC-1x) are the same as the basic cell BCl except the basic cell 1(BC-1) has an origin of (1,6) in the rectangular area 61 and the basic cell 2(BC-1x) in the lower portions of the rectangles 64 and 75 has an origin of (1,8) and being turned or flipped over with respect to the X axis. Furthermore, it is noted that the basic cells 1(BC-1) and 2(BC-1x) share the single source area 66 for the N channel transistors to be formed in the small rectangle 64 and share the single source are 67 for the P channel transistors to be formed in the small rectangle 65. For this reason the basic cell 2(BC-1x) has been flipped or turned over. The basic cell (BC-5x) in the lower portion of the area 61 is turned over to avoid an intersection of the output leads 3 and 5. It is more advantageous to make a single P-type well or region rather than two separate P-type wells in the semiconductor body.

Referring to FIG. 4c there is shown a cross-sectional view of the unit cell UC7 of FIG. 4a. In FIG. 4c the P-well region 68 is formed by the procedure described above to make it small. Basically each basic cell requires one P-well thereby enlarging the required cell area. According to the present embodiment of the invention, there a single P-well is formed which has provided therein all N-channel transistor areas of each basic cell. The PN junction 69 ends at the surface of the semiconductor body and determines the boundary of the P-well 68. The other portions of the active devices, the transistors, are not described because they are the same as in the previous embodiments hereinafter described.

Figure 5B:
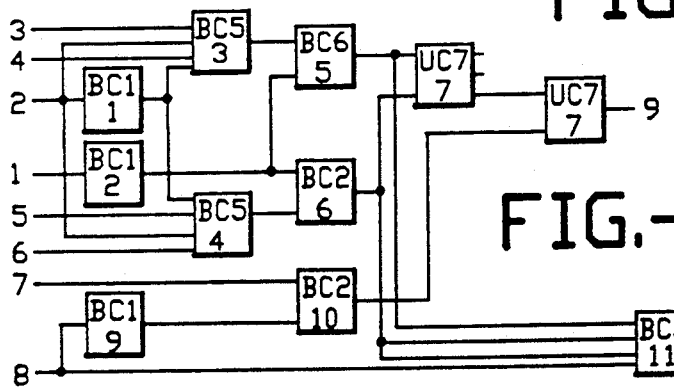
Figure 5C:
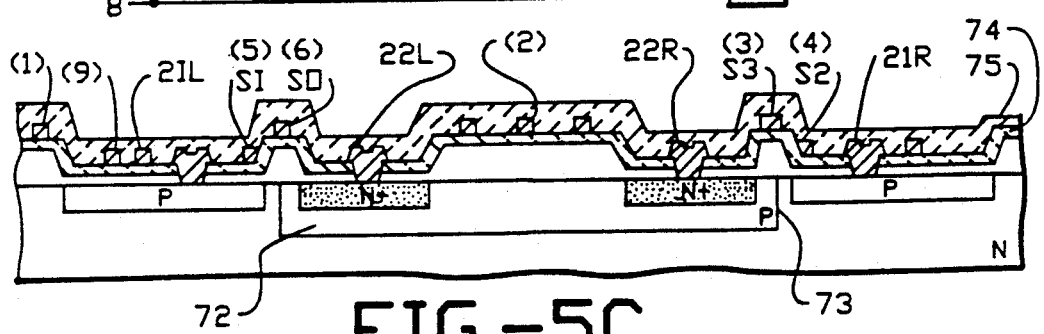
Figure 5A:
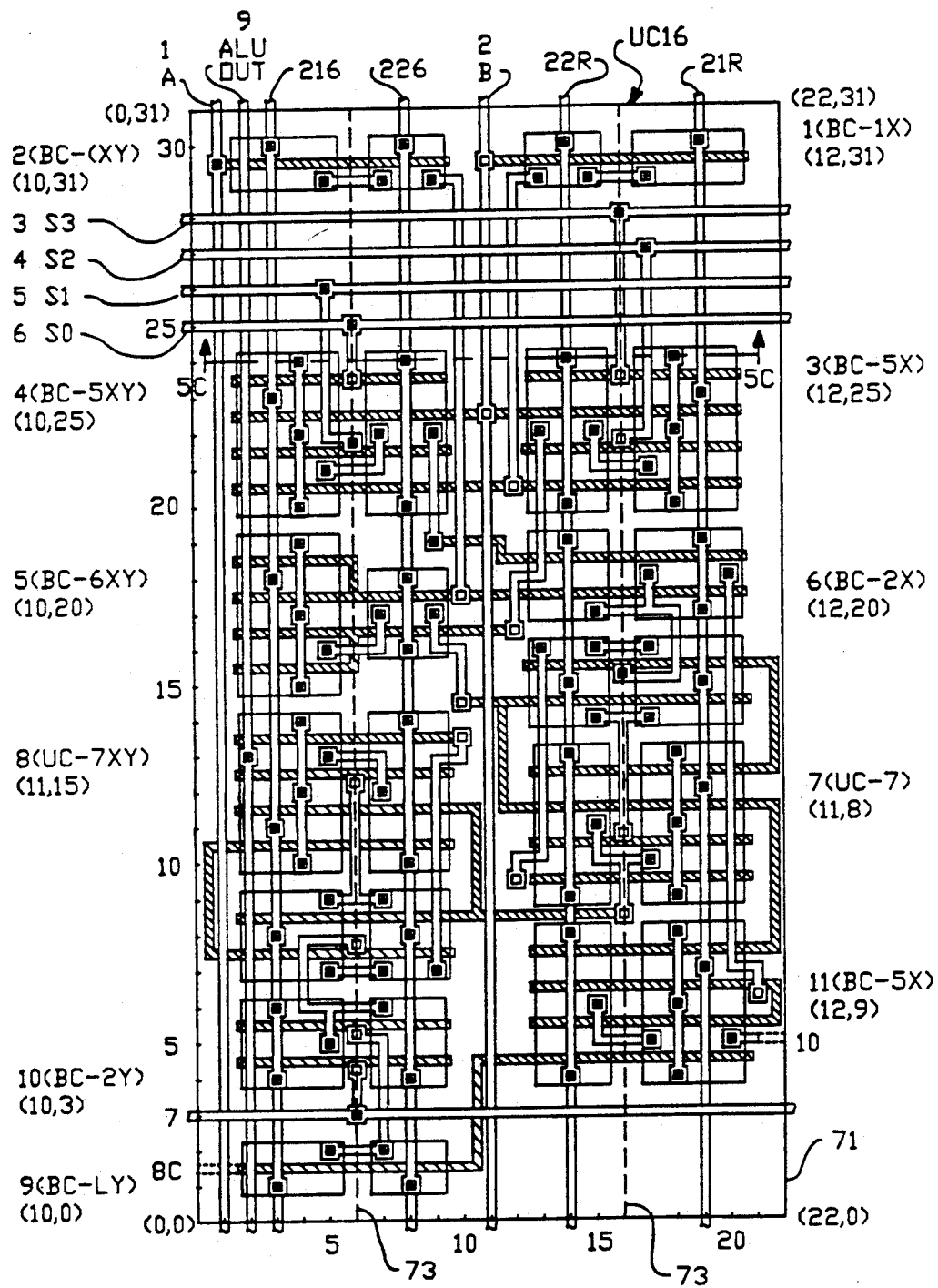
FIG. 5a is a plan view of another unit cell which serves as an arithmetic and logic unit (ALU) for even bits.
Figure 6A:
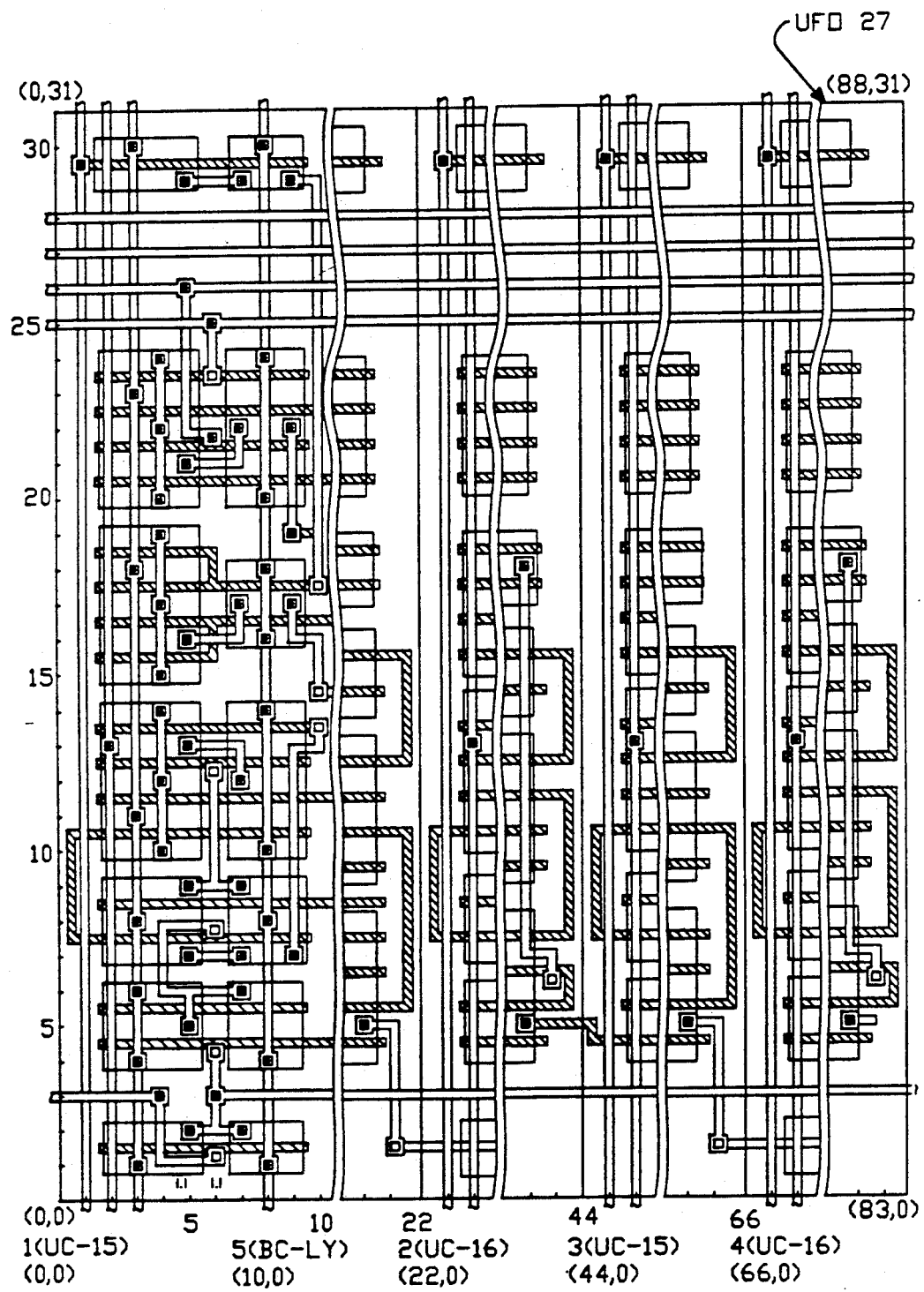
FIG. 6a is a plan view of the physical layout of a four bit ALU which has been identified as a UFO with certain portions broken away.

In FIGS. 5a and 5b there is shown the physical layout and the logic diagram for an arithmetic and logic unit (ALU) which is a one bit (even bit) ALU which has been identified as cell UC16. The unit shown has four mode control inputs. The unit can make arithmetic and logical operations such as addition, subtraction and logical AND, NOR, etc.

As can be seen the ALU as shown in FIG. 5a is formed in a rectangle 71 which is 22 units wide along the X axis and 31 units high along the Y axis. Multiplying the units along the X axis by 8 and the units along the Y xis by 10 and utilizing the 8 by 10 system hereinbefore described, gives the total area for the rectangle 71 as 54,560 square microns. Utilizing Cartesian coordinates the exact location of the UC16 can be ascertained on the wafer. A description of the components which make up the unit cell 16 is shown on the right and left hand sides of the rectangle 71. For example, the first component or basic cell on the right side has been identified as 1(BC-1x) with Cartesian coordinates of 12 and 31. These coordinates give the location of the origin of the basic cell. The indication also indicates that the basic cell 1 has been flipped about the X axis. The origin will then be in the upper left hand corner of the basic cell.

The second component or basic cell is on the left side and is identified as 2(BC-1xy) with Cartesian coordinates of 10 and 31 and with a basic cell flipped about the X and Y axes. The third component is on the right hand side and is identified as 3(BC-5x). It is flipped about the X axis and has its origin at the Cartesian coordinates 12 and 25. As can be seen, each component or basic cell of the unit cell UC16 has been identified with its coordinates and its orientation with respect to X and Y axes. The mode selection lines have been identified as S0, S1, S2, and S3. The numbers 3, 4, 5 and 6 also associated with these mode selection lines are also set forth in FIG. 5b. The other lines have also been identified by additional numbers. The lines 3 to 7 are for metal leads to be formed on an insulating layer. The insulating layer will cover the entire surface of the wafer or semiconductor body to insulate the ground bus, the power bus, the input leads, the output lead and other interconnecting leads from the basic cells.

As can be seen, the components 1, 3, 6 and 11 are flipped about X axis in the right hand side of the rectangle 71 and the components 2, 4, 5, 8, 10 and 9 are flipped about at least Y axis in the left hand side of the rectangle 71 so that the same type of circuit elements are closely arranged back-to-back with each other. This arrangement results in using only one P-well region including the same type of circuit elements in the rectangle 71.

To clarify this arrangement a cross sectional view of FIG. 5a is shown in FIG. 5c. In FIG. 5c, a single P-well 72 is including same type of circuit elements to which ground buses 22R and 22L are contacted. The PN junction 73 between the P well 72 and N type wafer extends to the surface of the wafer. The vertical lines shown in FIG. 5a are formed from a suitable metal layer such as aluminum provided on the glass layer 74. A second glass layer 75 covers the entire surface of the wafer on which the horizontal lines 3 to 7 are formed in the following steps.

Figure 6B:
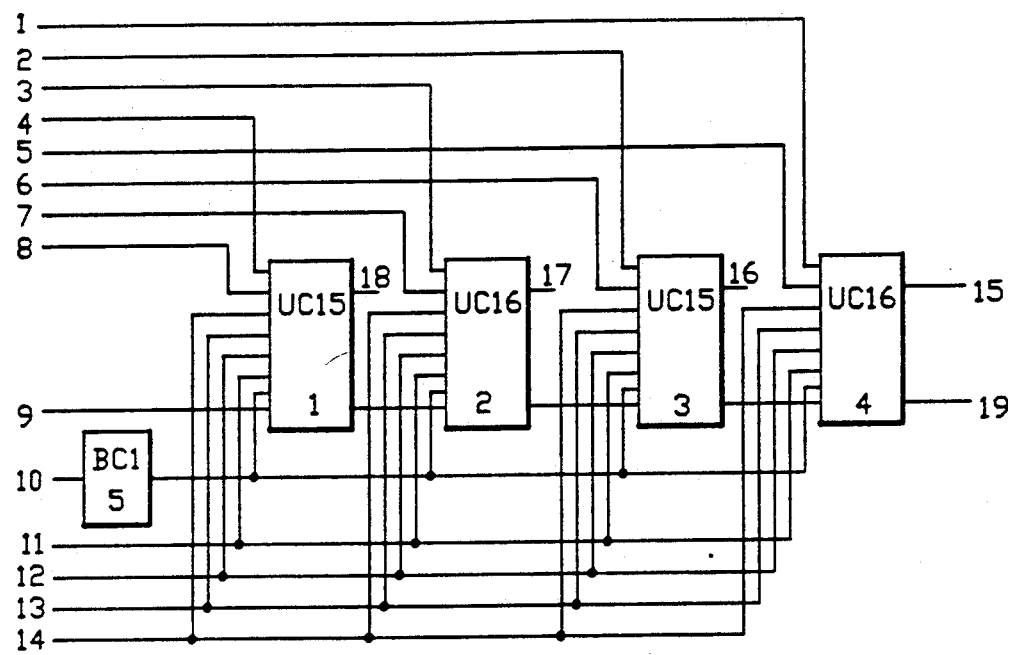

In FIG. 6a and 6b there is shown the physical layout in the logic diagram for functional block FB27 which represents a still higher level in the hierarchy and shows a 4-bit ALU. It consists of two unit cells UC15 and two unit cells UC16 and one basic cell BC1. In FIG. 6b there are shown pin numbers of differeing physical sizes. The larger pin numbers are for the FB whereas the smaller pin numbers are the unit cell pin numbers.

Figure 7:
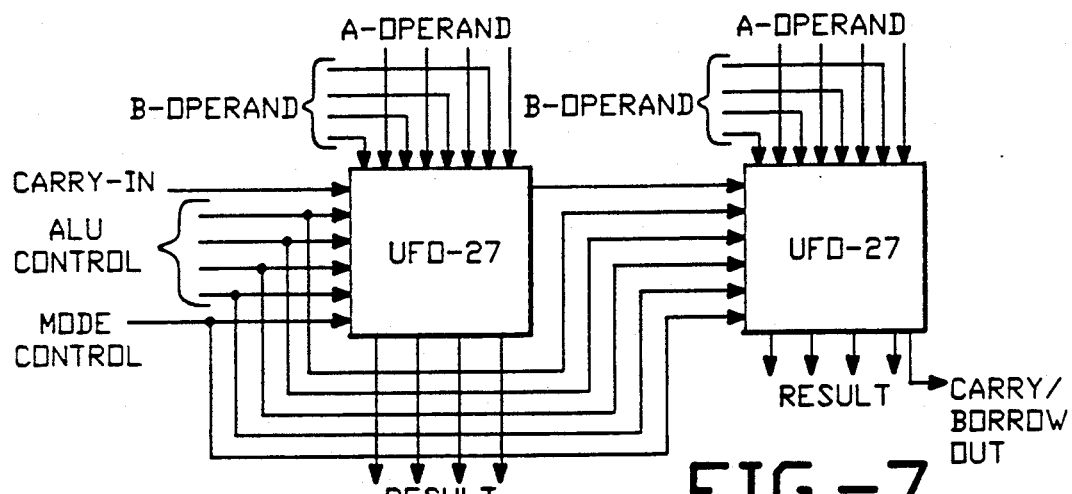
FIG. 7 is a block diagram of an eight bit ALU.

In FIG. 7, there is shown an 8-bit arithmetic/logic unit (ALU). It consists of two FB27's of the type shown in FIGS. 6a and 6b. As is also shown it is provided with a carry in lead and a mode control lead as labeled. In addition there are provided ALU control lines as shown which are connected into the FB27's. These ALU control lines determine whether addition or subtraction is performed by the FB's. The mode control lines determines whether an arithmetic or logical operation is to be performed by the ALU as shown in FIG. 7. At the top of each FB shown in FIG. 7 there are provided four A-operand lines and four B-operand lines. Thus, eight inputs are provided for each FB. Four output or result lines are provided for each FB and in addition, each FB is provided with a carry/borrow out line. Use of all these lines is well known to those skilled in the art and therefor will not be described in detail.

Figure 8:
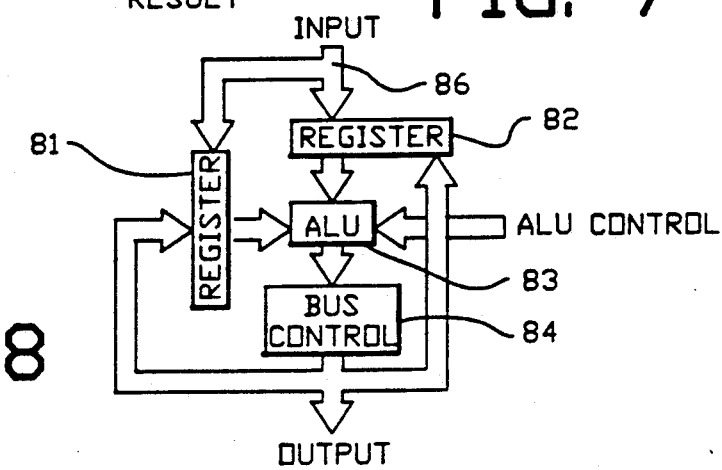
FIG. 8 is a simplified block diagram of an integrated circuit incorporating the present invention showing the highest level in the hierarchy.

In FIG. 8 there is shown a block diagram of a complete system. As shown therein, it consists of four functional blocks, two registers 81 and 82, an ALU 83, and a bus control 84. Data supplied on the input 86 is placed in the registers 81 and 82 and will be added or subtracted in accordance with the ALU control and the results will be placed in either one of the registers 81 or 82 in accordance with the bus control 84.

The block diagram in FIG. 8 in a simplified form characterizes the highest level of the system using the hierarchy of the present method. As is well known to those skilled in the art, such a system could include a number of additional block as for example an indirect address register, a comparator, a control storage register, a storage address register, a clock control, a decoder, etc. As can be appreciated, FIG. 8 is mainly discloses a typical system which can utilize the cellular integrated circuit and hierarchical method of the present invention. It also can be seen from the foregoing description that the system and method utilizes basic cells that serve as building blocks in a hierarchical structure and method. The basic cell size has been limited so that the same power and ground lines can be utilized for all the basic cells which are in a row in the wafer. The basic cells have been designed in such a manner that they can be expanded or contracted within the predetermined area without changing the interconnection or routings between the basic cells. It also can be seen that this concept makes it possible for an individual designer to handle more complex integrated circuits. It also makes it possible to provide systems which have a lower cost per unit of logic and increased performance. In addition, it makes possible a very low failure rate.

The various embodiments of the present invention described in connection with FIGS. 1 through 8 each include a semiconductor body having a surface arrayed in a grid pattern. The grid pattern is defined by a plurality of parallel first grid lines spaced apart by a first dimension and extending parallel to a first axis and by a plurality of parallel second grid lines spaced apart by a second dimension and extending parallel to a second axis. In FIG. 1a, for example, the first grid lines are the ones spaced apart and extending through the grid markings 13 parallel to the X axis. Similarly, the second grid lines, like grid line 32, extend parallel to the Y axis through the grid markings 13. The X and Y axes typically define Cartesian coordinates and hence intersect at an angle of 90 degrees. Therefore, the first grid lines intersect the second grid lines to define grid points such as grid points 16 of FIG. 1a. While an angle of 90 degrees between axes is preferred for simplicity, angles other than 90 degrees can also be employed.

Each of the cellular integrated circuit structures of the type described in FIGS. 1 through 8 includes a plurality of basic cells formed in the semiconductor body and having an area overlying a plurality of grid points. Each basic cell has first, second and third regions for making electrical connection to the basic cell. For example, in FIG. 1b, the region 40 has its top surface exposed for making contact with the power bus 21 through an opening in the insulating layer 33. In a similar manner, region 36 is exposed through an opening in the insulating layer 33 to make electrical connection to the ground bus 22. The regions 36 and 40 are located to overlie first and second ones of the plurality of grid points. Those grid points are the same ones which the power bus 21 and the ground bus 22 overlie as shown in FIG. 1a. The basic cells also have a third region spaced from selected ones of the grid lines so as to be located not to overlie any of the grid points. In FIG. 1a, for example, the input region 23 is such a third region. Note that the region 23 in FIG. 1 does not overlie any of the grid points 16 but rather is offset therefrom by some predetermined offset. The predetermined offset in FIG. 1a is approximately equal to one-half the dimension between the grid lines parallel to the X axis. Such a predetermined offset for the third region is significant in that any via hole connection made at a grid point does not contact the third region.

The power buses 21 and 22 are examples of conductors which are colinear with grid lines. While the input region 23 (third region) is located not to overlie the grid points, the relationship between that region and the conductors may be interchanged. For example, the input region 23 may be made colinear with one of the grid lines while one or more of the conductors 21 and 22 may be located with a predetermined offset from a grid line so as not to overlie any of the grid points. With such an interchange, via holes through the insulating layer do not cause unwanted contact between the conductors and the third region.

Some embodiments disclosed also include a plurality of linear regions or conductors spaced apart from each other by the same spacing as the grid lines but having a predetermined offset therefrom. In FIG. 3a, for example, the input regions 57 are such plurality of regions. None of the regions 57 overlie any of the grid points.

The basic cells discussed in connection with FIGS. 1 through 8 also include a fourth region which serves for making an electrical output connection. The fourth region is conveniently located to overlie grid points. Additionally, an output conductors, such as conductor 54 in FIG. 2a, located colinear with one or more grid lines may have via hole connections to the output fourth region without undesirably contacting the input regions (such as input regions 52 and 53 in FIG. 2a).

While the invention has been particularly shown and described with reference to the preferred embodiments thereof, it will be understood by those skilled in the art that those changes in form and details may be made therein without departing from the spirit and the scope of the invention.

What is claimed is:

1. In a semiconductor integrated circuit, said integrated circuit having portions defined with respect to a rectangular grid pattern superimposed thereon as a reference medium, said grid defined by horizontal lines separated by a predetermined first distance and vertical lines separated by a predetermined second distance,
   (a) a semicondutor body having a surface;
   (b) at least three distinct basic cell circuit structures having distinct function and design, each including a plurality of active circuit elements;
   (c) power and output connection regions for each basic cell, said regions overlying intersection points of said grid, each said power connection region disposed on a vertical grid line at a predetermined distance from each said other power connection region;
   (d) input connection regions for each basic cell, each spaced from elected grid lines so as not to overlie intersection points of said grid;
   (e) a plurality of unit cell circuit structures, each including a plurality of said basic cells;
   (f) a plurality of function block circuit structures, each including a plurality of said unit cells;
   (g) low impedance interconnections between said circuit structures, connecting selected ones of said input regions to selected ones of said output regions;
   (h) substantially vertical low impedance power connection lines for connecting said circuit structures to a power supply,
   wherein said circuit structures are arranged in a hierarchy having at least four levels including at least basic cells at the lowest level, unit cells and function blocks at increasingly higher levels, and the complete circuit at the highest level,
   each circuit structure disposed in a rectangular area of predetermined area or less for each said heirarchical level, each said rectangular area being substantially nonoverlapping with rectangular areas of other circuit structures at the same hierarchical level,
   each said higher level circuit structure rectangle enclosing only those lower level circuit structures that comprise said higher lever circuit structure, and
   said basic cell circuit structures disposed such that said power connection regions are vertically aligned to permit said substantially vertical power connection lines to supply power to all basic cell circuit structures coincident with said power connection lines.

2. A semiconductor integrated circuit as in claim 1, wherein said first distance is equal to or greater than twice the minimum spacing between the middle of parallel low impedance interconnections, and said second distance is equal to or greater than twice the minimum spacing between the middle of parallel low impedance power connection lines.

3. A semiconductor integrated circuit as in claim 1, wherein each basic cell includes a substantially horizontal input bus coincident with each said input connection region, said input bus located so as not to overlie intersection points of said grid.

4. A semiconductor integrated circuit as in claim 1, wherein there are at least sever basic cells, each of said seven basic cells adapted to perform an elementary logic or Boolean algebra function.

5. A cellular integrated circuit structure comprising,
   a semiconductor body having a surface; said integrated circuit structure having portions defined with respect to a grid pattern superimposed on said semiconductor body surface, said grid pattern defined by a plurality of parallel first grid lines spaced apart by a first dimension and extending parallel to a first axis and by a plurality of parallel second grid lines spaced apart by a second dimension and extending parallel to a second axis, said first and second axes intersecting at an angle whereby said first and second grid lines intersect to define grid points,
   a plurality of basic cells, each formed in said semiconductor body, each having an area overlying a plurality of said grid points, each having power, ground, input, and output regions for making electrical connections to the basic cell, said power and ground regions located to overlie first and second ones of said plurality of rid points, respectively, each having said input region spaced from selected ones of said grid lines so as to be located not to overlie said grid points,
   an insulating layer formed on said surface to overlie said basic cells and having openings at selected grid points,
   power and ground conductors carried by said insulating layer, said power and ground conductors substantially colinear with first and second ones of said grid lines, respectively, said power and ground conductors extending to overlie said first and second ones of said plurality of grid points, respectively, and to connect through openings in said insulating layer to said power and ground regions, respectively,
   input conductors underlying said insulating layer substantially parallel to said first axis and extending to connect to said input regions.

6. The circuit structure of claim 5 wherein said power and ground conductors are substantially parallel tos aid second axis, and wherein said output region overlies a selected grid point and where said structure further includes an output conductor colinear with a grid line so as to overlie said selected grid point and connect through said insulating layer to contact said output region at said selected grid point.

7. The circuit structure of claim 6 wherein said input region for each of said basic cells is colinear with al ine parallel to and spaced by a predetermined offset from selected ones of said grid lines parallel to said first axis, said predetermined offset less than said first dimension.

8. The circuit structure of claim 5 wherein said angle is ninety degrees.

9. A cellular integrated circuit structure comprising a semiconductor body having a surface; said integrated circuit structure having portions defined with respect to a grid pattern superimposed on said semiconductor body surface, said grid pattern defined by a plurality of parallel first grid lines spaced apart by a first dimension and extending parallel to a first axis and defined by a plurality of parallel second grid lines spaced apart by a second dimension and extending parallel to a second axis, said first and second grid lines intersect to define grid points, a plurality of basic cells, each formed in said semiconductor body, each having an area overlying a plurality of said grid points, each having first, second, third, and fourth regions for making power, grounds, input and output electrical connections, respectively, to the basic cell, an insulating layer formed on said surface to overlie said basic cells and having openings for connections at certain ones of said plurality of grid points, each of said basic cells having said first and second regions located to overlie first and second ones of said plurality of grid points, respectively; each of said basic cells having said third region spaced from selected ones of said plurality of grid liens and parallel to said first axis so as to be located not to overlie said plurality of said grid points, where said third region for each of said basic cells is colinear with a line parallel to and spaced by a predetermined offset from selected ones of said grid lines parallel to aid first axis where said predetermined offset is less than said first dimension; each of said basic cells having said fourth region overlying another selected grid point; where said another selected grid point is not any of said first and second ones of said plurality of grid points;

first and second conductors, comprising power and ground buses, respectively, carried by said insulating layer, said first and second conductors substantially colinear with first and second ones of said grid lines parallel to said second axis, respectively said first and second conductors extending to overlie said first and second ones of said plurality of grid points, respectively, and to connect through first and second ones of said openings in said insulating layer to said first and second regions, respectively; a plurality of third conductors for providing input signals to said basic cells, each of said third conductors parallel to said first axis and spaced by said predetermined offset from one of said selected ones of said plurality of grid lines so as to intersect and contact said third region; a plurality of fourth conductors for providing output signals from said basic cells, each fourth conductor substantially colinear with a grid line so as to overlie said another selected grid point and connect through said insulating layer to contact said fourth region at said another selected grid point.

10. The circuit structure of claim 9 wherein at least one of said basic cells includes a plurality of additional regions substantially parallel to said third region and spaced from said third region and spaced apart from each other by said first dimension whereby none of said additional regions overlies any of said plurality of grid points and wherein each of said additional regions is connected to a different one of said third conductors.

11. The circuit structure of claim 9 including a first group of leads carried by said semiconductor body for interconnecting said basic cells to form a plurality of unit cells, each of said unit cells being larger than each of said basic cells, each of said unit cells being disposed in one of a plurality of substantially nonoverlapping second rectangular areas; a second group of leads carried by said semiconductor body for interconnecting said unit cells into a plurality of functional blocks, each of said functional blocks being larger than each of said unit blocks, each of said functional blocks being disposed in one of a plurality of substantially nonoverlapping third rectangular areas; and, a third group of leads carried by said semiconductor body for interconnecting said functional blocks into said integrated circuit.

* * * * *